United States Patent
Fastow et al.

(10) Patent No.: US 6,750,157 B1
(45) Date of Patent: Jun. 15, 2004

(54) NONVOLATILE MEMORY CELL WITH A NITRIDATED OXIDE LAYER

(75) Inventors: Richard M. Fastow, Cupertino, CA (US); Chi Chang, Redwood City, CA (US); Narbeh Derhacobian, Belmont, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 13 days.

(21) Appl. No.: 10/199,793

(22) Filed: Jul. 19, 2002

Related U.S. Application Data (63) Continuation-in-part of application No. 09/689,538, filed on Oct. 12, 2000, and a continuation-in-part of application No. 09/689,378, filed on Oct. 12, 2000, and a continuation-in-part of application No. 09/697,791, filed on Oct. 26, 2000.

(51) Int. Cl.[7] .............................. H01L 21/31
(52) U.S. Cl. .................. 438/786; 438/257; 438/260; 438/261; 438/778; 438/783; 438/791
(58) Field of Search ................. 257/314, 315, 257/318, 321, 324; 438/257, 260, 261, 786, 778, 783, 791

(56) References Cited

U.S. PATENT DOCUMENTS

| | | |
|---|---|---|
| 4,958,321 A | 9/1990 | Chang |
| 5,077,691 A | 12/1991 | Haddad et al. |
| 5,335,198 A | 8/1994 | Van Buskirk et al. |
| 5,407,870 A * | 4/1995 | Okada et al. .............. 438/591 |
| 5,457,336 A | 10/1995 | Fang |
| 5,470,773 A | 11/1995 | Liu et al. |
| 5,517,443 A | 5/1996 | Liu et al. |
| 5,561,620 A | 10/1996 | Chen et al. |
| 5,590,076 A | 12/1996 | Haddad et al. |
| 5,596,531 A | 1/1997 | Liu et al. |
| 5,598,369 A | 1/1997 | Chen et al. |
| 5,617,357 A | 4/1997 | Haddad et al. |

(List continued on next page.)

FOREIGN PATENT DOCUMENTS

| | | |
|---|---|---|
| WO | 9907000 | 2/1999 |

OTHER PUBLICATIONS

T.Y. Chan, et al., "A True Single–Transistor Oxide–Nitride–Oxide EEPROM Device," IEEE Electron Device Letters, vol. EDL–8, No. 3, March 1987, pp. 93–95.

Hisa, Yukun, et al., "MNOS Traps and Tailored Trap Distribution Gate Dielectric MNOS," 1980, Japanese Journal of Applied Physics, vol.19, Supp. 19–1, pp. 245–248.

Fukuda, et al., Novel N2O–Oxinitridation Technology for Forming Highly Reliable EEPROM Tunnel Oxide Films, IEEE Elec. IEEE Elec. Device Lett., 12 (Nov. 1991) 587.

White, et al., A Low Voltage Sonos Nonvolatile Semiconductor Memory Technology, IEEE Trans. Components, Packaging & Manufacturing Tech., 20 (Jun. 1997) 190.

*Primary Examiner*—Richard Elms
*Assistant Examiner*—Doug Menz
(74) *Attorney, Agent, or Firm*—Amin & Turocy, LLP

(57) ABSTRACT

One aspect of the present invention relates to a system and method for improving memory retention in flash memory devices. Retention characteristics may be enhanced by nitridating the bottom silicon dioxide layer of the ONO dielectric. To further mitigate charge leakage within the memory cell, the charge retention layer, or silicon nitride layer of the ONO dielectric, may be passivated via a hydrogen anneal process in order to reduce the number of charge traps, and thus, the amount of charge loss. The present invention also provides a monitoring and feedback-relay system to automatically control ONO formation such that a desired ONO dielectric stack is obtained. The present invention may be accomplished in part by employing a measurement system to measure properties and characteristics of the ONO stack during the critical formation steps of the bottom silicon dioxide layer and a silicon nitride layer.

12 Claims, 10 Drawing Sheets

U.S. PATENT DOCUMENTS

| | | | |
|---|---|---|---|
| 5,629,893 A | 5/1997 | Tang et al. | |
| 5,652,155 A | 7/1997 | Liu et al. | |
| 5,708,588 A | 1/1998 | Haddad et al. | |
| 5,768,192 A | 6/1998 | Eitan | |
| 5,805,502 A | 9/1998 | Tang et al. | |
| 5,844,840 A | 12/1998 | Le et al. | |
| 5,852,582 A | 12/1998 | Cleveland et al. | |
| 5,856,946 A | 1/1999 | Chan et al. | |
| 5,907,781 A | 5/1999 | Chen et al. | |
| 5,909,396 A | 6/1999 | Le et al. | |
| 5,912,489 A | 6/1999 | Chen et al. | |
| 5,933,730 A | 8/1999 | Sun et al. | |
| 5,939,763 A * | 8/1999 | Hao et al. | 257/411 |
| 5,966,618 A | 10/1999 | Sun et al. | |
| 5,972,751 A | 10/1999 | Ramsbey et al. | |
| 5,981,404 A * | 11/1999 | Sheng et al. | 438/791 |
| 5,991,202 A | 11/1999 | Derhacobian et al. | |
| 5,999,452 A | 12/1999 | Chen et al. | |
| 6,001,689 A | 12/1999 | Van Buskirk et al. | |
| 6,001,713 A | 12/1999 | Ramsbey et al. | |
| 6,011,725 A | 1/2000 | Eitan | |
| 6,017,791 A * | 1/2000 | Wang et al. | 438/253 |
| 6,037,235 A * | 3/2000 | Narwankar et al. | 438/396 |
| 6,063,666 A * | 5/2000 | Chang et al. | 438/261 |
| 9,080,639 | 6/2000 | Huang et al. | |
| 6,133,605 A | 10/2000 | Kishi | 257/325 |
| 6,143,608 A | 11/2000 | He et al. | |
| 6,143,612 A | 11/2000 | Derhacobian et al. | |
| 6,159,795 A | 12/2000 | Higashitani et al. | |
| 6,160,317 A | 12/2000 | Sun et al. | |
| 6,166,951 A | 12/2000 | Derhacobian et al. | |
| 6,177,322 B1 | 1/2001 | Derhacobian et al. | |
| 6,188,606 B1 | 2/2001 | Derhacobian et al. | |
| 6,198,664 B1 | 3/2001 | Fastow | |
| 6,207,978 B1 | 3/2001 | Fastow | |
| 6,215,148 B1 | 4/2001 | Eitan | 257/316 |
| 6,245,689 B1 * | 6/2001 | Hao et al. | 438/769 |
| 6,248,628 B1 * | 6/2001 | Halliyal et al. | 438/257 |
| 6,252,270 B1 | 6/2001 | Gregor et al. | 257/315 |
| 6,294,430 B1 * | 9/2001 | Fastow et al. | 438/264 |
| 6,348,420 B1 * | 2/2002 | Raaijmakers et al. | 438/769 |
| 6,384,448 B1 | 5/2002 | Forbes | |
| 6,395,654 B1 * | 5/2002 | Yang et al. | 438/306 |
| 6,512,264 B1 * | 1/2003 | Ogle et al. | 257/324 |
| 6,559,007 B1 * | 5/2003 | Weimer | 438/257 |

* cited by examiner

NONVOLATILE MEMORY CELL WITH A NITRIDATED OXIDE LAYER

CROSS REFERENCE TO RELATED APPLICATIONS

This application is a continuation-in-part of copending U.S. application Ser. No. 09/689,538 entitled NONVOLATILE MEMORY CELL WITH A P+ POLYSILICON GATE and filed on Oct. 12, 2000; of U.S. application Ser. No. 09/689,378 entitled NONVOLATILE MEMORY CELL WITH A HYDROGEN ANNEALED CHARGE RETENTION LAYER and filed on Oct. 12, 2000; and U.S. application Ser. No. 09/697,791 entitled NONVOLATILE MEMORY CELL WITH A NITRIDATED OXIDE LAYER and filed on Oct. 26, 2000, the entirety each application is incorporated herein by reference.

TECHNICAL FIELD

The present invention generally relates to processing a semiconductor substrate. In particular, the present invention relates to a method for fabricating a memory cell device which exhibits improved retention characteristics.

BACKGROUND ART

Memory devices for non-volatile storage of information are currently in widespread use today in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

Flash memory is a type of electronic memory media which can be rewritten and hold its content without power. Flash memory devices generally have life spans from 100K to 300K write cycles. Unlike dynamic random access memory (DRAM) and static random access memory (SRAM) memory chips, in which a single byte can be erased, flash memory is typically erased and written in fixed multi-bit blocks or sectors. Evolving out of electrically erasable read only memory (EEPROM) chip technology, which can be erased in place, flash memory is less expensive and denser. This new category of EEPROMs has emerged as an important non-volatile memory which combines the advantages of EPROM density with EEPROM electrical erasability.

Conventional flash memories are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. Lastly, a polysilicon control gate overlies the interpoly dielectric layer.

The interpoly dielectric layer is often a multilayer insulator such as an oxide-nitride-oxide (ONO) layer having two oxide layers sandwiching a nitride layer. However, the bottom oxide layer of the multilayer ONO insulator has a tendency to allow charge stored in the nitride layer of the multilayer ONO to leak. This results in severe difficulties in programming, reading and erasing the memory cell. As scaling down of memory cell devices continues, the need to form thinner ONO dielectric layers without compromising programming and erasure abilities of the device increases. In conventional EEPROM devices, a phosphorous doped N+ polysilicon gate may be employed as the polysilicon control gate. However, the use of a N+ polysilicon gate limits the minimum thickness of the bottom oxide layer to be greater than 50 angstroms. This is because a thickness less than 50 angstroms would lead to direct tunneling of charge stored in the middle nitride layer down into the bottom oxide layer. Accordingly, the use of a N+ polysilicon gate can cause problems in memory cell fabrication because it can hinder the ability to reduce the thickness of the ONO gate stack material.

The control gate is connected to a word line associated with a row of such cells to form sectors of such cells in a typical NOR configuration. In addition, the drain regions of the cells are connected together by a conductive bit line. The channel of the cell conducts current between the source and the drain in accordance with an electric field developed in the channel by the stacked gate structure. In the NOR configuration, each drain terminal of the transistors within a single column is connected to the same bit line. In addition, each flash cell has its stacked gate terminal connected to a different word line, while all the flash cells in the array have their source terminals connected to a common source terminal. In operation, individual flash cells are addressed via the respective bit line and word line using peripheral decoder and control circuitry for programming (writing), reading or erasing functions.

Such a single bit stacked gate flash memory cell is programmed by applying a voltage to the control gate and connecting the source to ground and the drain to a predetermined potential above the source. A resulting high electric field across the tunnel oxide leads to a phenomena called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a voltage is applied to the source, and the control gate is held at a negative potential, while the drain is allowed to float. Under these conditions, an electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

In conventional single bit flash memory devices, an erase verification is performed to determine whether each cell in a block or set of such cells has been properly erased. Current single bit erase verification methodologies provide for verification of bit or cell erasure, and application of supplemental erase pulses to individual cells which fail the initial verification. Thereafter, the erased status of the cell is again verified, and the process continues until the cell or bit is successfully erased or the cell is marked as unusable.

Recently, dual bit flash memory cells have been introduced, which allow the storage of two bits of information in a single memory cell. The conventional programming and erase verification methods employed with single bit stacked gate architectures are not adequate for such dual bit devices. Recently, dual bit flash memory structures have been introduced that do not utilize a floating gate, such as an ONO flash memory device that employs a polysilicon layer over the ONO layer for providing wordline connections. Conventional fabrication techniques do not address the characteristics associated with these types of devices. Therefore, there is an unmet need in the art for improved data retention in a scaled down dual bit memory architecture.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

A novel memory cell structure and a methodology are provided for fabricating a memory cell, such as a nonvolatile memory, operating in dual bit mode. The present invention facilitates optimizing the performance of the memory cell such as improving asymmetrical programming and reading of the memory cell by improving the retention of charges within discreet layers/locations of the memory cell structure.

More specifically, optimizing the performance of the memory cell may be accomplished in part by using a P+ polysilicon gate as opposed to a conventional N+ polysilicon gate. Unlike phosphorous doped N+ polysilicon gates, the P+ polysilicon gate facilitates a reduction of internal energy fields in the adjacent dielectric layer, thereby mitigating charge leakage or tunneling from a charge retention layer (e.g., a silicon nitride layer of an ONO dielectric) to an underlying tunnel oxide layer. As a result, a thinner (e.g., less than 50 angstroms) tunnel oxide layer, for example, a bottom silicon dioxide layer within the ONO dielectric, may be employed.

Alternatively or in addition, retention characteristics may also be enhanced by nitridating the bottom silicon dioxide layer of the ONO dielectric. The nitridation process allows for a thinner or scaled down silicon dioxide layer to be implemented without compromising charge retention and the structural and functional integrity of the bottom silicon dioxide layer or the memory cell, in general. To further mitigate charge leakage within the memory cell, the charge retention layer, or silicon nitride layer of the ONO dielectric, may be passivated via a hydrogen anneal process. Because the charge retention layer may have undesirable charge traps from which charge is easily lost, passivating the layer with a hydrogen anneal may mitigate and decrease the number of charge traps, and thus, the amount of charge loss. Consequently, memory retention of the cell is substantially improved, especially in memory cells which utilize hot carrier injections to program and erase.

The present invention also provides a monitoring and feedback-relay system to automatically control ONO formation such that a desired ONO dielectric stack is obtained. The present invention may be accomplished in part by employing a measurement system such as spectroscopy, ellipsometry, and/or scatterometry to measure properties and characteristics of the ONO stack during the critical formation steps of the bottom silicon dioxide layer and the silicon nitride layer.

One aspect of the present invention relates to a novel memory cell structure. The memory cell structure includes a substrate comprising a first region and a second region with a channel therebetween and a polysilicon gate above said channel; a hydrogen-annealed charge retention region comprising an amount of charge, wherein said amount of charge is self-aligned at a first junction between the first region and the substrate and at second a junction between the second region and the substrate in order to narrow said charge retention region to facilitate easier punch through; and a nitridated layer positioned between said channel and said charge retention region, wherein said layer has a thickness such that said amount of charge is prevented from directly tunneling into said layer. The first and second regions are both source/drain regions, since the memory cells can be dual bit memory cells.

Another aspect of the present invention relates to a method of making an ONO charge retaining dielectric stack on a memory cell using feedback control. The method includes forming a bottom silicon dioxide layer over said channel on the substrate and below the gate; applying a nitridation process treatment to the bottom silicon dioxide layer, the nitridation process treatment comprising a plasma containing nitrogen; determining whether the nitridation process treatment is substantially completed by measuring the bottom silicon dioxide layer; after nitridating the bottom silicon dioxide layer is substantially completed, depositing a charge retention region over the nitridated bottom silicon dioxide layer; annealing said charge retention region with plasma containing hydrogen; determining whether the hydrogen anneal process treatment is substantially completed by measuring the silicon nitride layer; and after annealing the charge retention region is substantially completed, depositing a top dielectric layer over the hydrogen annealed charge retention region.

Yet another aspect of the present invention relates to an enhanced memory cell. The memory cell contains a substrate comprising a drain and a source with a channel therebetween and a P+ polysilicon gate above said channel; a hydrogen-annealed silicon nitride layer formed over the substrate comprising an amount of charge, wherein said amount of charge is self-aligned at a first junction between said drain and said substrate and at second a junction between said source and said substrate in order to narrow said charge retention region to facilitate easier punch through; and a nitridated silicon dioxide layer positioned between said channel and said hydrogen annealed silicon nitride layer, wherein said nitridated silicon dioxide layer has a thickness less than 50 angstroms such that said amount of charge is prevented from tunneling into said nitridated silicon dioxide layer.

Still yet another aspect of the present invention relates to a system for improving retention characteristics of a memory cell by monitoring in situ formation of an ONO dielectric stack thereon. The system contains a partially fabricated memory cell having at least a portion of the ONO dielectric stack formed over a silicon substrate, the at least a portion of the ONO dielectric stack having a treatment applied thereto; an ONO measurement monitor for collecting data from the layer before, during, and after the treatment is administered to the layer; a process controller operatively coupled to one or more components of the system such that the process controller receives and analyzes the data from the ONO measurement monitor to determine whether the treatment has been effective to modify the portion of the ONO dielectric stack; and one or more ONO treatment components operatively coupled to the process controller for applying the treatment to the portion of the ONO dielectric stack.

DISCLOSURE OF INVENTION

The present invention involves a system and method for improving the memory retention of a non-volatile memory cell operating in a dual bit mode. More specifically, the system and method involve treating an ONO dielectric stack using feedback control to regulate treatments applied to at least two critical layers of the ONO stack: a bottom silicon dioxide layer and a silicon nitride layer formed on or over the bottom silicon dioxide layer. By way of example, a nitridation process treatment can be applied to the bottom silicon dioxide layer in order to minimize charge leakage. The nitridation process and the effected silicon dioxide layer can be monitored and controlled.

Also by way of example, the silicon nitride layer may undergo a passivation procedure via a hydrogen anneal process in order to mitigate the presence of undesirable charge traps. Similarly, the hydrogen anneal process can be monitored and controlled in situ.

Regulating the treatments may be accomplished in part by employing a monitoring system. Before, during and after each treatment process, the respective layers are individually monitored to determine whether the treatments have been effective and to determine a current state of the layers. The formation of each layer may also be monitored and controlled by the monitoring system.

The monitoring system includes a measurement system such as spectroscopy, ellipsometry and/or scatterometry systems, and the like, whereby light is used to obtain information about each layer. For example, light reflectivity data can be gathered in order to ascertain surface characteristics of the measured layer. By collecting measurements of the individual layers, a comparison analysis may be performed to determine whether the treatment to a particular layer has been effective. In doing so, the state or status (e.g., layer is nitridated, layer is annealed) of the layer can be deduced.

According to one aspect of the present invention, data collected by the monitoring system is communicated to the treatment components for the particular layer, where at such time, adjustments to the components may be made to affect either a current or subsequent treatment process, or both. Examples of data which can be relayed back to the treatment components or fed forward to other system components to affect the current layer and/or subsequent layers include surface characteristics, profiles, reflectivities, and the like.

With respect to the nitridation process, the bottom silicon dioxide layer may be nitridated via a plasma containing nitrogen in order to mitigate charge leakage from the ONO stack to the channel. The nitridation process may be performed by applying an anodizing voltage during exposure of the silicon dioxide layer to a plasma containing nitrogen ($N_2$) such as nitrous oxide ($N_2O$). The plasma may be administered at appropriate parameters (e.g., pressure, flow rate, temperature, duration, power) suitable to incorporate nitrogen into the bottom silicon dioxide layer in an amount sufficient to reduce charge leakage from the ONO stack. The bottom silicon dioxide layer may have a thickness from about 50 angstroms to about 200 angstroms. Because of the nitridation process, the bottom silicon dioxide layer may also have a thickness less than about 50 angstroms.

As to the silicon nitride layer, the passivation process may be performed by hydrogen annealing the silicon nitride layer. The hydrogen anneal process may be performed under suitable conditions sufficient to remove any unwanted charge traps occurring primarily at or near the surface of the silicon nitride layer.

In order to determine whether the treated layers (e.g., silicon dioxide and silicon nitride layers) have been properly modified by their respective treatment processes, the layers are individually and separately monitored and measured before the treatment process begins as well as during and after the treatment process. In particular, data obtained before the treatment process begins serves as a base level for later comparison between untreated and treated layers (e.g., silicon dioxide, silicon nitride) to which data obtained during and/or after the treatment terminates can be compared.

A processor performs a comparison analysis of the collected data and based on the results of the analysis, formulates instructions relating to the manner in which the treatment and ONO fabrication processes should proceed. The instructions are communicated to the treatment controller and/or treatment components for implementation into the processes. Types of instructions include, for example, making one or more adjustments to the one or more treatment components and directing the controller and/or components to continue, interrupt, or terminate the treatment with respect to the current layer. It should be appreciated that the data may be collected and processed throughout the duration of the treatment in such a way that the processor may formulate instructions to temporarily interrupt or terminate the current treatment before it is completed.

Once the ONO dielectric stack has been properly formed as described above, a P+ polysilicon gate layer is formed over the ONO stack (e.g., on a top oxide layer). The P+ polysilicon gate layer provides many advantages over the conventional N+ polysilicon gate such as reducing charge tunneling from a silicon nitride layer to a bottom silicon dioxide layer, particularly when the bottom silicon dioxide layer has a thickness of less than 50 angstroms. Thus, scaled down memory cells requiring smaller and thinner ONO stacks can be achieved without compromising memory retention and performance, in part, by employing a P+ polysilicon gate directly over the ONO dielectric stack.

An improved memory cell structure and a method for fabricating the same are described below in further detail with respect to FIGS. 1–14.

Figure 1:
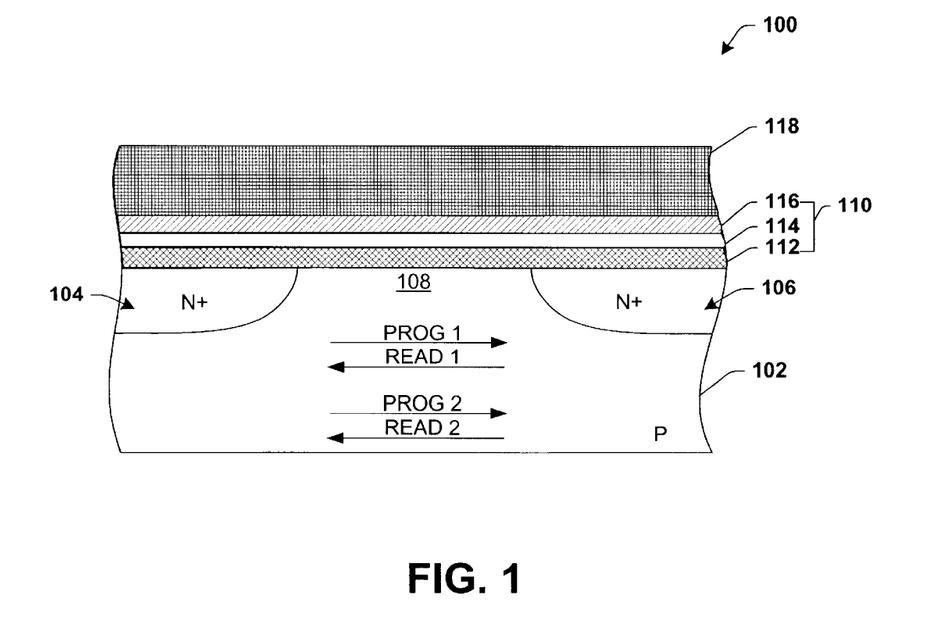
FIG. 1 illustrates a schematic cross-sectional view of a memory cell in accordance with the present invention.

FIG. 1 illustrates an example of a dual bit memory cell 100 constructed in accordance with an aspect of the present invention. The memory cell 100 resides on a P-type substrate 102, although other conductivity types could be used. Diffusion regions 104 and 106 are formed in the substrate 102, which correspond to interchangeable N+ source and drain regions. A channel region 108 extends between the diffusion regions 104 and 106 and is of the same conductivity type as the substrate 102. The diffusion regions 104 and 106 define first and second bit lines, respectively.

A multilayer dielectric stack 110 resides over the channel region 108 and at least part of the diffusion regions 104 and 106. The insulating stack 110 is an interpoly dielectric material that provides a charge retention gate layer. The insulating stack 110 includes three layers 112, 114, and 116 disposed between a P+ polysilicon gate layer 118 and the diffusion and channel regions 104, 106, and 108. The bottom layer 112 of the stack is a nitridated gate dielectric and the intermediate charge retention layer 114 is a passivated nitride material substantially free of charge traps at least at the surface. The top layer 116 of the stack 110 is gate dielectric. The P+ polysilicon gate layer 118 provides a word line connection to the memory cell 118. That is, word lines can be patterned in the polysilicon gate layer 118.

In accordance with one aspect of present invention, the bottom layer 112 of the stack 110 is a nitridated silicon dioxide layer, generally referred to as a nitridated tunneling oxide layer. More specifically, the nitridation process involves exposing the bottom silicon dioxide layer to a plasma containing nitrogen such as $N_2$ and $N_2O$ in order to mitigate charge leakage from such layer. The nitridation process incorporates nitrogen atoms onto at least the silicon dioxide surface as well as into the bulk oxide below the surface. Those skilled in the art will understand and appreciate various oxides (and gate dielectrics) that can be utilized in accordance with an aspect of the present invention. By way of illustration, various oxides that are commonly used as gated dielectrics can be used to form the layer 112, including, for example, $SiO_2$, $TiO_2$, $Y_2O_3$, $Gd_2O_3$, $HfO_2$, $Ta_2O_5$, and the like.

In accordance with another aspect of the present invention, the intermediate layer 114 of the stack 110 is hydrogen-annealed charge retention layer such as a hydrogen-annealed silicon nitride layer. That is, the intermediate layer 114 has undergone a passivation process in order to mitigate the presence of unwanted charge traps. In addition, the intermediate layer 114 can be a silicon oxynitride layer (e.g., $SiO_xN_y$, where x and y are selected to provide desired properties) or a silicon rich nitride layer (e.g., SiRN).

The hydrogen-annealed charge retention region contains an amount of charge, wherein the amount of charge is self-aligned at a first junction (diffusion region 104) between the first region and the substrate and at a second junction (diffusion region 106) between the second region and the substrate in order to narrow the charge retention region to facilitate easier punch through.

The top layer 116 of the stack 110 also is a dielectric layer. The layer 116 can be the same or a different silicon dioxide from the layer 112. For example, the top dielectric layer 116 may include at least one of silicon dioxide, silicon oxynitride, and silicon carbonitride. The top silicon dioxide layer 116 mitigates both charge injection from the top P+ poly gate layer 118 as well as leakage of charge back up into the poly gate structure at layer 118.

While the stack 110 has been described as comprising three layers, it will be understood and appreciated that other numbers of layers can be utilized to form the stack. In particular, one or more suitable materials can be used to form the passivated silicon nitride layer 114, with the top gate dielectric layer 116 over the silicon nitride layer 114.

Figure 2:
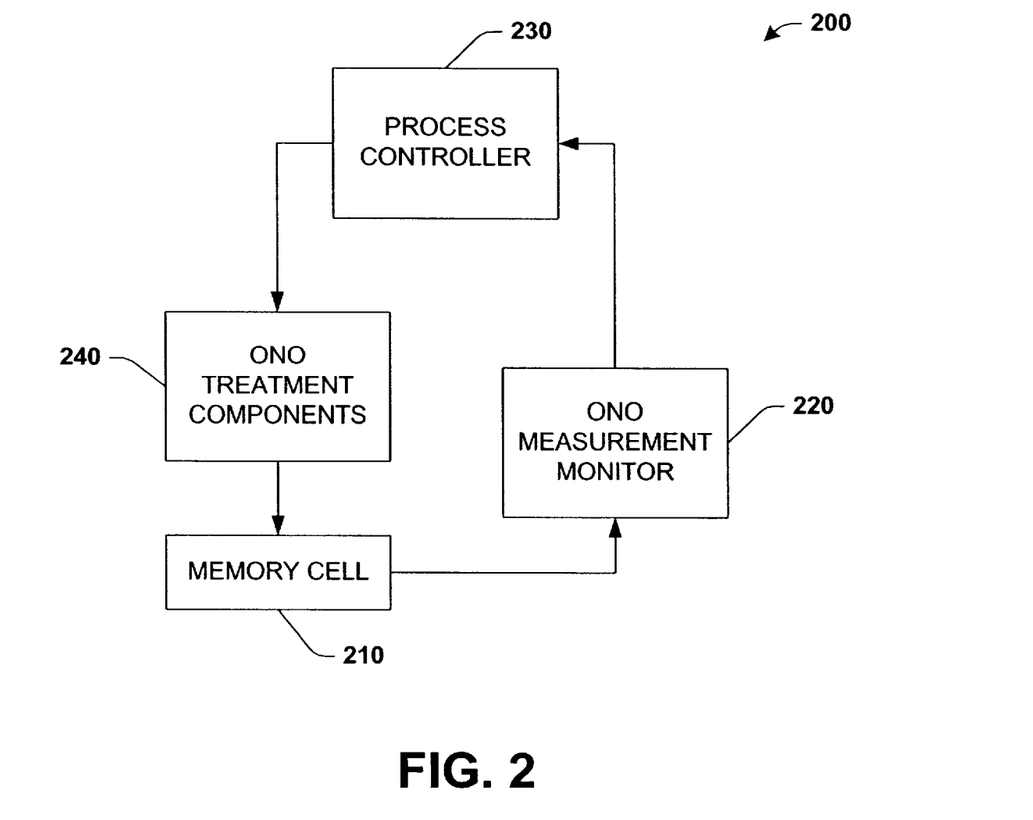
FIG. 2 illustrates a high level schematic block diagram of a system for monitoring and regulating in situ formation of a dual bit memory cell in accordance with an aspect of the present invention.
Figure 3:
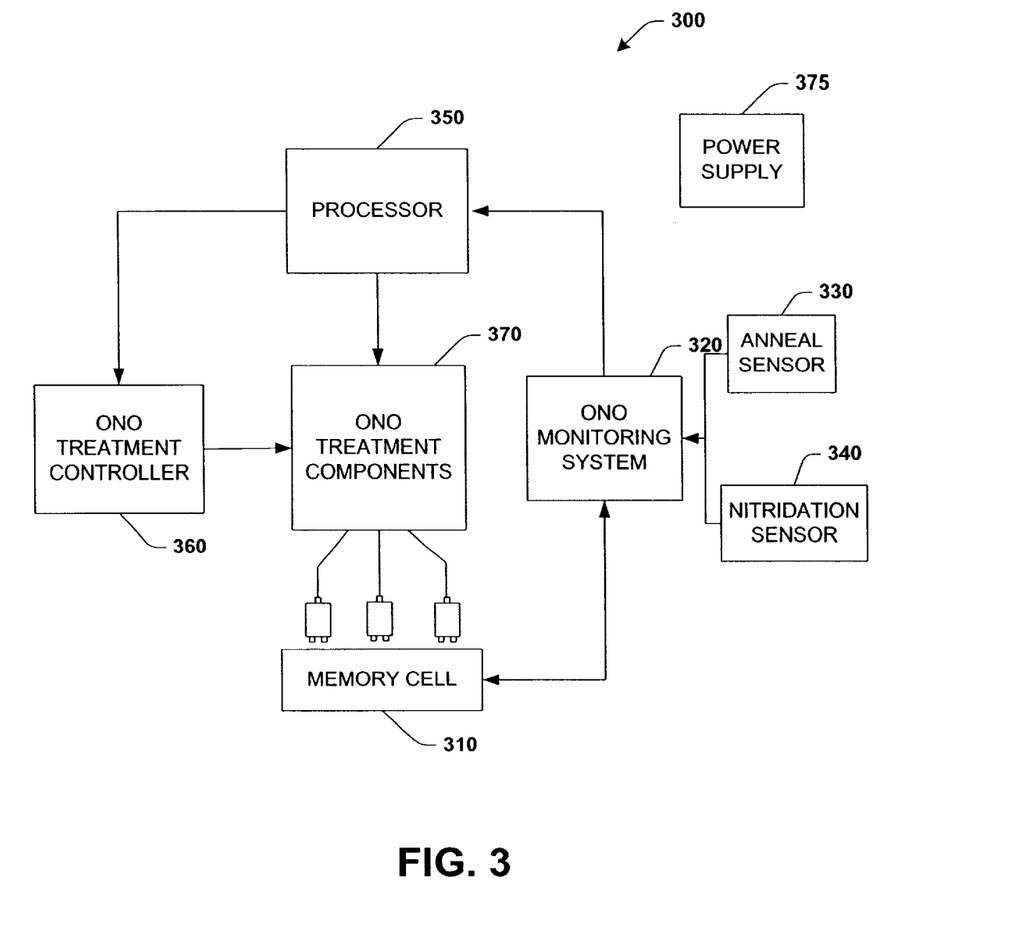
FIG. 3 illustrates a schematic block diagram of a system for fabricating an ONO stack using feedback control in accordance with another aspect of the present invention.
Figure 4:
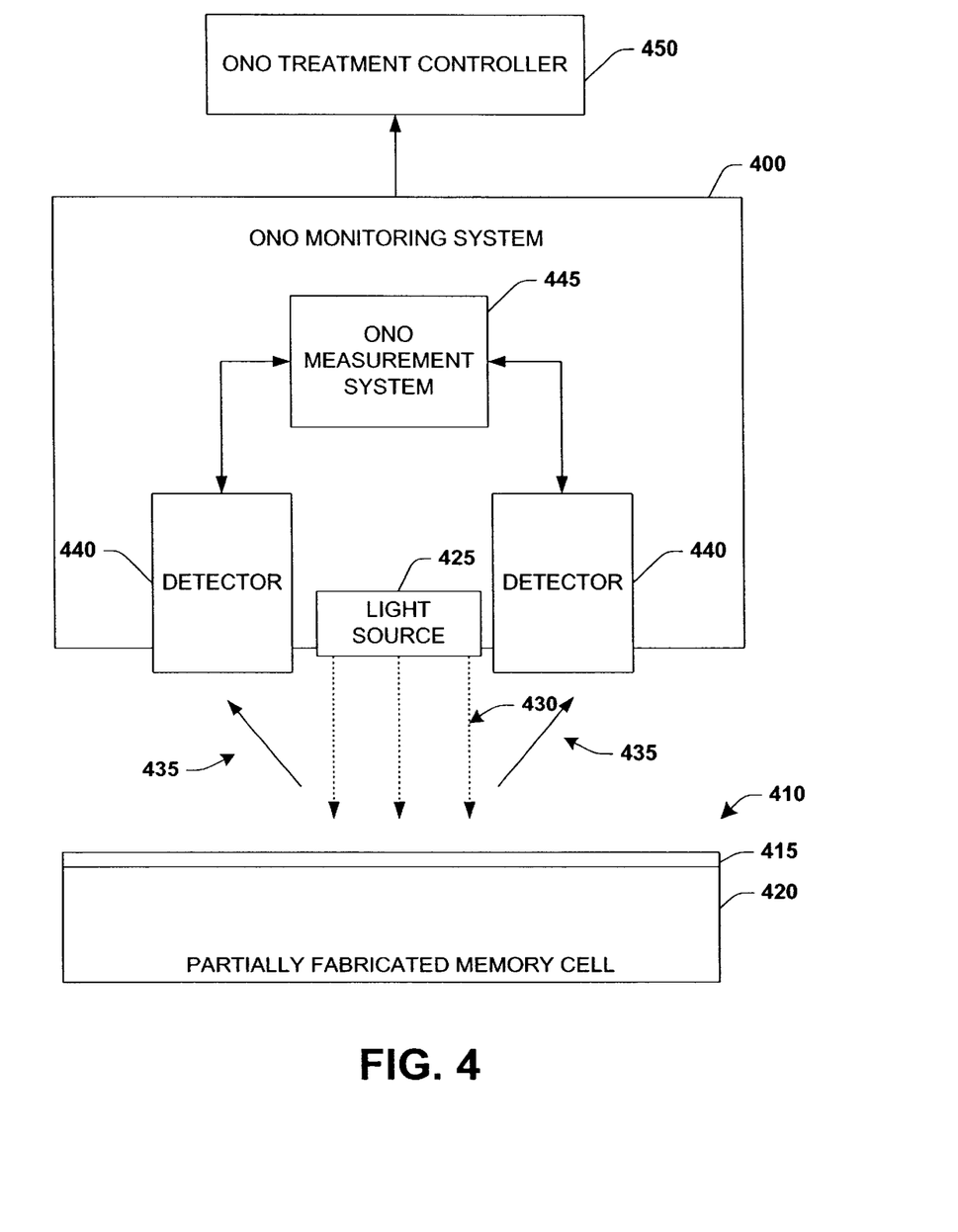
FIG. 4 illustrates a schematic block diagram of an ONO monitoring system for fabricating an ONO stack in accordance with another aspect of the present invention.

FIGS. 2–4 illustrate examples of systems which may be employed to fabricate and monitor treatments applied to fabricated layers of a memory cell in accordance with an aspect of the present invention.

Turning to FIG. 2, a high-level schematic block diagram of a system 200 for monitoring in situ an ONO fabrication process is shown in accordance with one aspect of the present invention. The system 200 is programmed to treat particular layers of material with specific treatment applications. For example, particular systems within the system 200 can be programmed to apply a nitridation process to the memory cell 210. The system 200 comprises a partially fabricated memory cell 210, an ONO measurement monitoring system 220, a process controller 230, and one or more ONO treatment components 240. According to one aspect of the present invention, the memory cell 210 includes a p-type substrate of a suitable thickness to carry out the present invention. In addition, one or more layers of material may be formed thereon. In particular, the uppermost layer of the memory cell 210 may be prepared to grow or receive a bottom silicon dioxide layer thereon, the bottom silicon dioxide layer being part of an ONO dielectric stack yet to be formed.

The system 200 is programmed to treat particular layers of material with specific applications. For example, particular systems such as the ONO treatment components 240 are programmed to apply a nitridation process to the bottom silicon dioxide layer formed on the partially fabricated the memory cell 210. Alternatively or in addition, the treatment components 240 are programmed to passivate a silicon nitride layer which has been formed over the bottom silicon dioxide layer.

During each treatment, the ONO measurement monitoring system 220 collects data from the particular layer as the treatment progresses. The data relates to the surface characteristics of the layer and thus a state of the layer can be ascertained. For example, the state of the layer may be that it has been altered by the treatment as desired. A comparison analysis may be performed by the process controller 230 using the collected data in order to determine whether the treatment of the layer has been effective. The comparison analysis involves comparing the data collected from the layer before treatment began, during the treatment, and after the treatment has ceased. The comparison analysis may be performed repeatedly or at timed intervals throughout a treatment process.

The process controller 230 provides instructions to the system 200 to either proceed with the fabrication process or to make adjustments to the treatment components 240. The instructions given to the system 200 depend on the results of the comparison analysis. According to one aspect of the present invention, the layer may be treated for a second time under the modified treatment conditions. According to another aspect of the present invention, the present memory cell may be discarded and the process parameters may be adjusted to affect subsequent treatments.

FIG. 3 illustrates a schematic block diagram of a system 300 for monitoring in situ ONO fabrication and treatment processes with respect to a memory cell in accordance with an aspect of the present invention. The system 300 includes a partially fabricated memory cell 310 which is prepared for an ONO dielectric stack to be formed thereon. The system 300 also includes an ONO monitoring system 320 which contains one or more sensor systems such as an anneal sensor 330 and a nitridation sensor 340. The monitoring system 320 activates one or more sensor systems depending on the layer being treated.

For example, when the bottom silicon dioxide layer of an ONO dielectric stack is being formed on the memory cell 310, the nitridation sensor 340 is activated to collect the data from the layer since it about to undergo a nitridation process treatment. Likewise, the anneal sensor is activated to collect the data from a silicon nitride layer which is about to undergo an anneal process treatment, such as a hydrogen anneal process. Data can also be collected from corresponding ONO treatment components 370 that are applying the particular treatment. The data gathered from the layer facilitates a "visualization" of the structural and/or physical changes occurring to at least the surface of the layer.

The monitoring system communicates the collected data to a processor 350 operatively coupled thereto for a comparison analysis. The processor 350 compares the data from the layer taken before the treatment began with the data from the layer taken during and/or after the treatment in order to determine whether the layer has been altered by the process treatment. Data of the layer gathered before the treatment can serve as a base line value. The results of the comparison analysis are formulated into instructions for an ONO treatment controller 360. Such instructions may be in form of adjustments to one or more ONO treatment components 370 which can be implemented by the controller 360. The one or more components 370 may correspond to plasma type, flow rate, pressure, duration, temperature, power, and the like.

In addition, the processor 350 may be pre-programmed with standard values relating to sufficiently treated layers such that collected data from the treated layer may be calculated for comparison in order to determine whether the layer has been sufficiently treated.

Thus the system 300 facilitates feedback control of the treatment process by gathering information relating to the treated layer, processing it, and relaying it back to one or more system components (e.g., controller 360, components 370) in order to affect an adjustment to the treatment process for the current layer/process treatment and/or subsequent layers. In other words, once adjustments to the one or more components 370 are implemented, the current layer may undergo a second process treatment and the monitoring of the second treatment process continues. Alternatively or in addition, the collected data and/or formulated instructions may be fed forward to other processing stations within the fabrication assembly line.

A power supply 375 is also included in the system 300. Examples of suitable power supplies include batteries and the like which are sufficient to operate the system 300 for its intended purpose.

The monitoring system 320 may be described in further detail with respect to FIG. 4 of the present invention. FIG. 4 illustrates a schematic diagram of an ONO monitoring system 400 such as described in the system 300 of FIG. 3. The monitoring system 400 is shown interacting with a partially fabricated memory cell 410 in which an ONO dielectric stack 415 is being formed over a p-type substrate 420.

According to one aspect of the present invention, a light source 425 directs one or more beams of light 430 (e.g., infrared, x-ray, and the like depending on the desired wavelength and instrument used) at one or more locations on the ONO dielectric stack being formed, for example, at one or more locations on a bottom silicon dioxide layer 415 which is undergoing a nitridation process treatment. The reflected light 435 is detected and collected by one or more detectors 440. Using more than one detector may facilitate obtaining additional data relating to the state of the layer as it is being treated.

The detectors 440 communicate the collected data to an ONO measurement system 445. The measurement system 445 processes the collected data into a form usable to the monitoring system 400 as well as other system components such as an ONO treatment controller 450 and one or more process treatment components (not shown). Alternatively, the measurement system 445 may transmit the collected data to a separate processor (not shown) for analysis in order to determine whether the layer has been properly treated and affected by such process treatment.

It should be appreciated that following the successful nitridation process, a silicon nitride layer portion of the ONO dielectric stack 415 may be formed on the nitridated bottom silicon dioxide layer and subsequently treated with a hydrogen anneal process treatment. Formation of the ONO dielectric continues with formation of a top silicon dioxide layer over the annealed silicon nitride layer and so on in order to completely form the memory cell 410.

As discussed above with respect to FIGS. 2–4, the present invention may provide feedback control of a layer treatment process, particularly with respect to the bottom silicon dioxide and silicon nitride layers of an ONO dielectric stack in a memory cell. In particular, the monitoring system 400 and the treatment controller 450 are operatively connected to adjust process treatment parameters in order to achieve a desired ONO dielectric stack. Feedback control of the process treatments allows the current treatment and subsequent treatments to be applied to the respective layers with greater accuracy and precision and with fewer defects or flaws. For example, the present invention may be applied to a number of test wafers in order to account for wafer to wafer variations and to obtain ideal process treatment parameters for subsequent layers. Employing test wafers in this manner reduces waste and costs associated with such waste. The present invention may also be employed to maximize batch processing of wafers and to facilitate the scaling down process of memory cells.

FIGS. 5–13 illustrate an example of process steps that can be utilized to produce a memory cell (e.g., such as shown in FIG. 1) in accordance with an aspect of the present invention. Those skilled in the art will understand and appreciate various departures from the process steps shown herein that can be utilized to produce a memory cell in accordance with an aspect of the present invention. For example, other numbers of layers and types of layers can be utilized from those shown and described herein.

Figure 5:
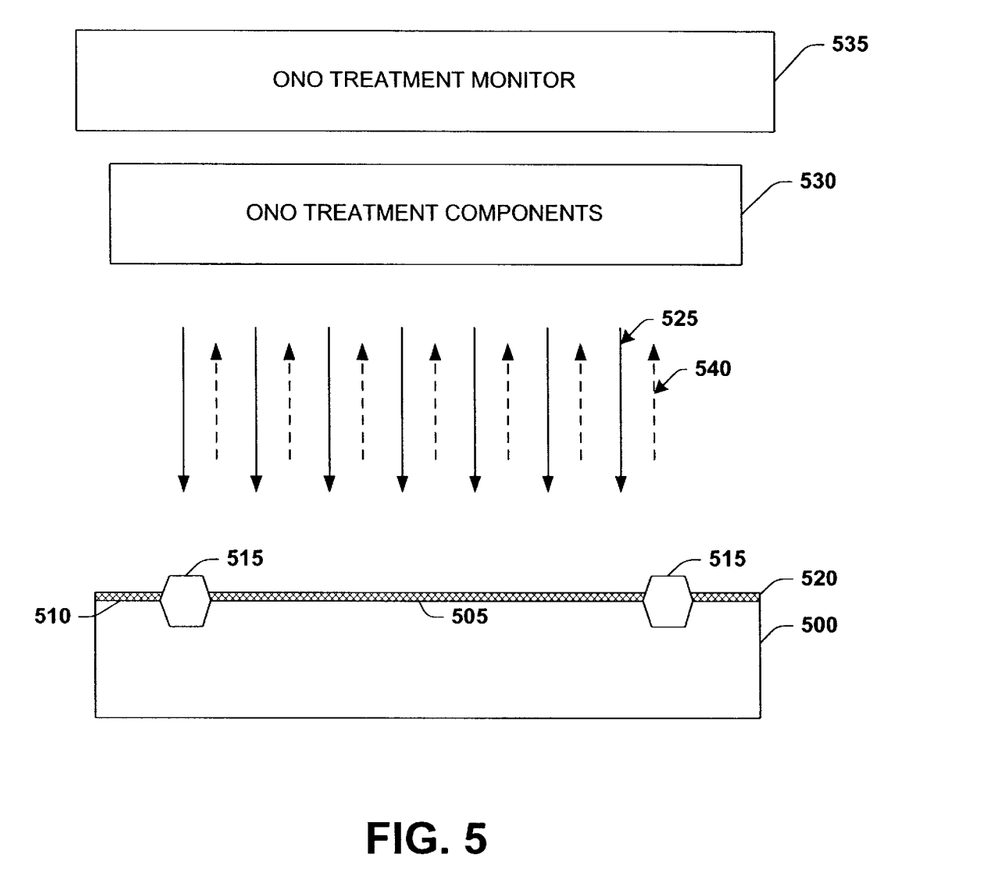
FIG. 5 illustrates a schematic cross-sectional view of a silicon dioxide layer formed over a silicon layer having an oxide shallow trench isolation therein in accordance with an aspect of the present invention.

Turning to FIG. 5, a P-type silicon substrate 500 provides a foundation on which a memory cell is fabricated. A core portion 505 of the substrate is blocked off from a periphery portion 510 by a shallow trench isolation (STI) material 515. STI involves etching a trench into the top silicon layer 500 and filling the trench with an isolation material, such as an oxide. Local oxidation of silicon (LOCOS) isolation processes generally occupy a great deal of wafer surface area, and thus STI provides for an alternative isolation technique, although either technique can be used.

Still referring to FIG. 5, a bottom silicon dioxide layer 520 is formed over the core portion 505 and the periphery 510, such as by a known formation process. The bottom silicon dioxide layer 520, for example, can be $SiO_2$ or another gate dielectric material, such as $TiO_2$, $Y_2O_3$, $Gd_2O_3$, $HfO_2$, $Ta_2O_5$, etc.

Upon substantially complete formation of the bottom silicon dioxide layer 520, the layer 520 undergoes a nitridation process in order to incorporate nitrogen atoms into at least the surface of the bottom silicon dioxide layer for the purpose of reducing charge leakage. The bottom silicon nitride layer 520 is exposed to a plasma containing nitrogen such as nitrous oxide ($NO_2$), for example, as indicated by solid arrows 525. The exposure is performed by one or more ONO treatment components 530. The nitridation process treatment of the layer 520 is controlled in part by an ONO treatment monitor 535. The ONO treatment monitor 535 collects data from the bottom silicon dioxide layer 520 before, during and after treatment of the layer 520, as indicated by broken arrows 540. The data is used in a comparison analysis to determine whether the layer 520 has been properly affected by the treatment to a degree sufficient to mitigate charge leakage.

The mitigation of charge leakage in the bottom silicon dioxide layer 520 is particularly critical when scaling down the thickness of the layer 520 below 50 angstroms. In the present invention, the bottom silicon dioxide layer 520 may be formed having a thickness less than 50 angstroms, especially when a P+ polysilicon gate is formed over the ONO dielectric stack, as described in FIG. 12 below.

Figure 6:
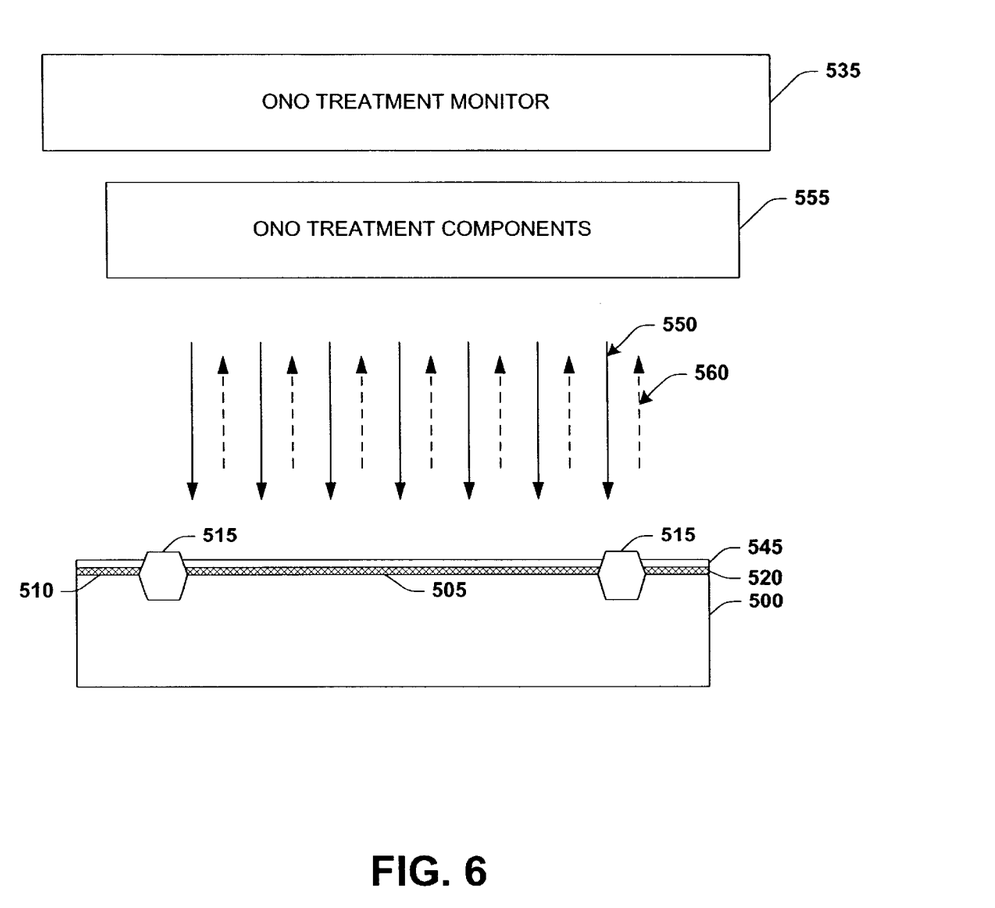
FIG. 6 illustrates a schematic cross-sectional view of the structure of FIG. 5 having a silicon nitride layer formed over the silicon dioxide layer in accordance with an aspect of the present invention.

When it has been determined that the bottom silicon dioxide layer 520 has been effectively treated by the nitridation process, formation of the ONO dielectric stack may continue as described in FIG. 6.

FIG. 6 illustrates a silicon nitride layer 545 formed over the nitridated bottom silicon dioxide layer 520 in accordance with an aspect of the present invention. As mentioned above, the silicon nitride layer 545 can be $SiO_xN_y$, SiRN, as well as other layers containing nitride that can function as a charge retention layer within the ONO dielectric stack. The silicon nitride layer 545 undergoes a passivation process whereby the surface of the silicon nitride 545 is smoothed in order to remove undesirable charge traps from at least the surface of the silicon nitride layer. Removal of such charge traps reduces charge tunneling or leakage. The silicon nitride layer 545 is exposed to a plasma containing hydrogen and at a temperature suitable to promote annealing of the layer 545, as indicated by solid arrows 550. The exposure is performed by one or more ONO treatment components 555. The hydrogen anneal process treatment of the layer 545 is controlled in part by an ONO treatment monitor 535 as described in FIG. 5. The ONO treatment monitor 535 collects data from the silicon nitride layer 545 before, during and after treatment of the layer 545, as indicated by broken arrows 560. The data is used later in a comparison analysis to determine whether the layer 545 has been properly affected by the treatment to a degree sufficient to mitigate the unwanted tunneling of charge from the layer 545 to the nitridated bottom silicon dioxide layer 520.

When it has been determined that the silicon nitride layer 545 has been sufficiently passivated by the hydrogen anneal process, formation of the remaining layers of the ONO dielectric stack as well as other portions of the memory cell may proceed.

Figure 7:
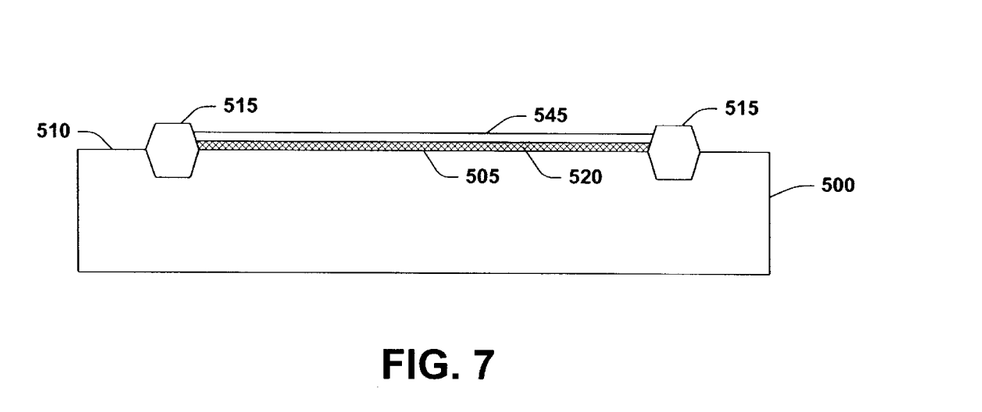
FIG. 7 illustrates a schematic cross-sectional view of the structure of FIG. 6 undergoing processing in accordance with an aspect of the present invention.

FIG. 7 illustrates the structure of FIG. 6 after the layers 520 and 545 have been etched away from the periphery portion 510. As a result, the nitridated bottom silicon dioxide layer 520 and the hydrogen annealed silicon nitride layer 545 remain over the core portion 505 of the silicon substrate 500. The layers 520 and 545 thus form an annealed nitride/nitridated oxide stack over the core portion 505.

Figure 8:
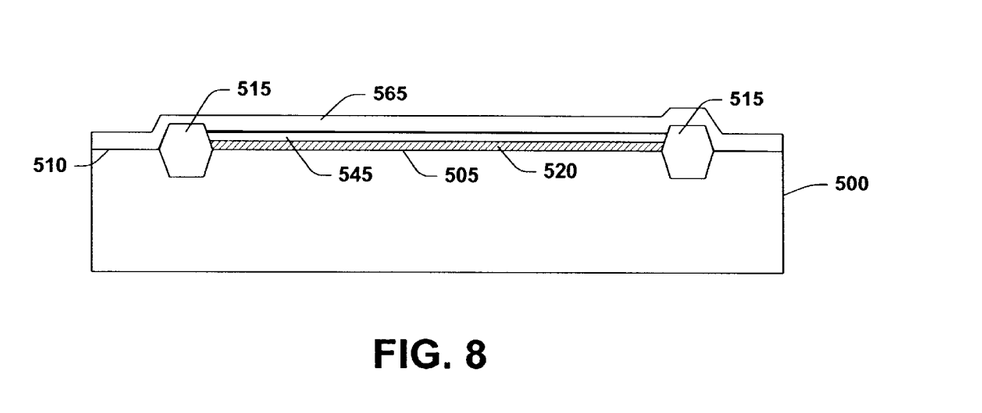
FIG. 8 illustrates a schematic cross-sectional view of the structure of FIG. 7 having a photoresist formed thereover in accordance with an aspect of the present invention.
Figure 9:
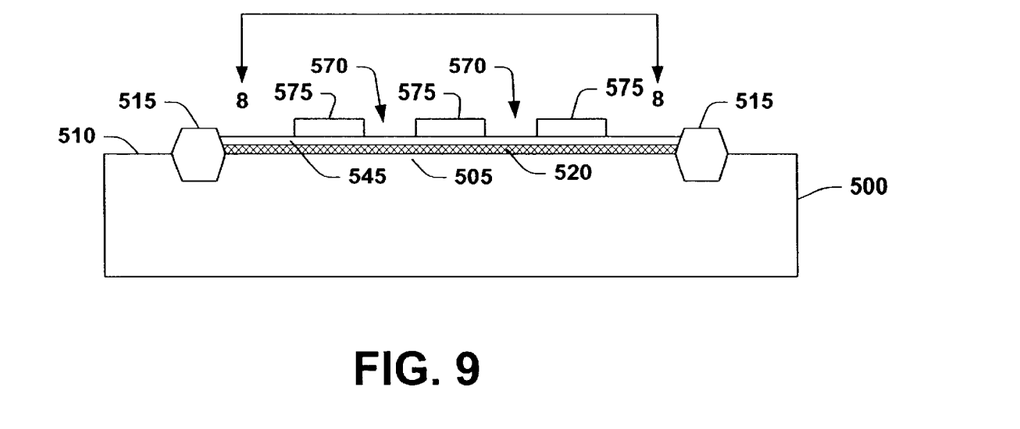
FIG. 9 illustrates a schematic cross-sectional view of the structure of FIG. 8 in which part of the photoresist layer has been developed to provide a line space pattern in accordance with an aspect of the present invention.

In FIG. 8, a photoresist layer 565 has been applied over the layers 520 and 545 on the structure of FIG. 7. The photoresist layer 565 is patterned by exposing the resist to light having a desired wavelength to transfer a desired pattern onto the resist. The patterned resist layer 565 is then developed, which dissolves the resist in the exposed portions to reveal spaces 570 formed in the resist over the core portion 505. The photoresist is removed using additional chemicals or plasma. In particular, the spaces 570 extend between resist line portions 575 of the developed resist material, such as shown in FIG. 9. In FIG. 9, the resist portions 575 are spaced apart from each other by the spaces 570 so as to form a mask to facilitate formation of diffusion regions in the substrate 500.

Figure 10:
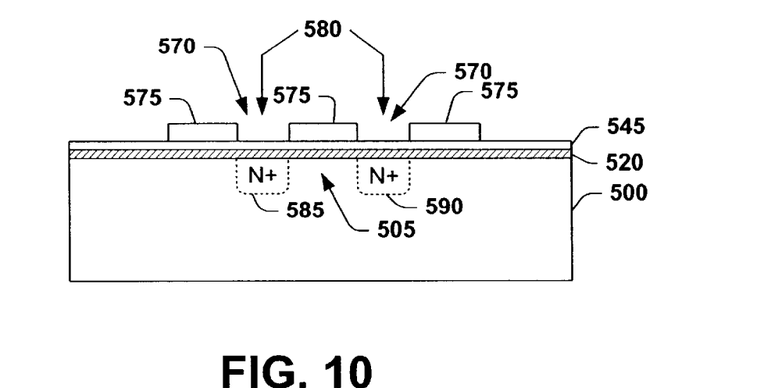
FIG. 10 illustrates a schematic cross-sectional view of the structure of FIG. 9 in which diffusion regions are being formed in accordance with an aspect of the present invention.

FIG. 10 illustrates part of the structure of FIG. 9, taken along line 8—8 in FIG. 9. That is, FIG. 10 illustrates the core portion 505 and layers 520, 545, 575 that have been applied over the core portion 505. In FIG. 10, a dopant 580 is implanted through the spaces 570 between the resist line portions 575 and through the layers 545 and 520. For example, an N+ implant 580 is performed through the hydrogen annealed silicon nitride layer 545 and nitridated silicon dioxide layer 520 to form N+ diffusion regions 585 and 590 in core portion 505 of the substrate 500 beneath the spaces 570. The resist line portions 575 serve as masks to inhibit ion implantation in the core portion 505 underlying the resist line portions. The resulting diffusion regions 585 and 590 thus have a contour according to the configuration of the spaces 570 between the resist portions 575.

Figure 11:
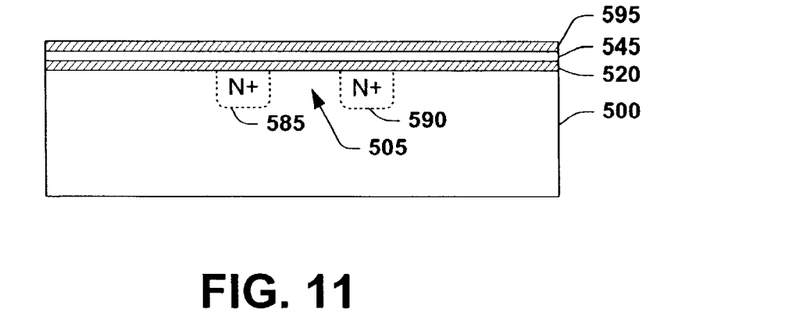
FIG. 11 illustrates a schematic cross-sectional view of the structure of FIG. 10 having a silicon dioxide layer formed over the silicon nitride layer in accordance with an aspect of the present invention.

After the diffusion regions 585 and 590 have been formed, the resist portions 575 are stripped from the structure, such as by applying an appropriate solvent and then cleaning the structure. As shown in FIG. 11, a top silicon dioxide layer 595 is applied over the hydrogen annealed silicon nitride 545. The top silicon dioxide layer 595 serves a dual purpose.

It inhibits charge injection from a subsequently applied layer as well as inhibits charge leakage into the subsequently applied gate layer from the diffusion regions 585 and 590. The top and bottom silicon dioxide layers 595 and 520, respectively, of the silicon dioxide/hydrogen annealed silicon nitride/nitridated silicon dioxide stack 520, 545, 595 typically are thicker than about 50 Angstroms to mitigate direct tunneling. However, because the bottom silicon dioxide layer 520 has been nitridated, its thickness may be less than 50 angstroms.

Figure 12:
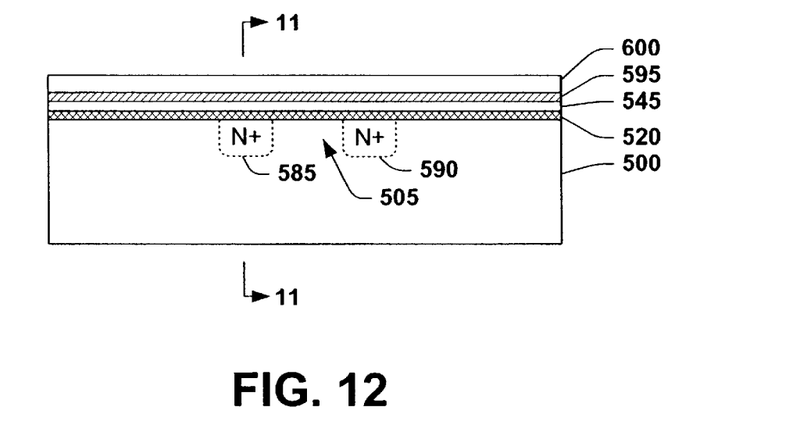
FIG. 12 illustrates a schematic cross-sectional view of the structure of FIG. 11 having a polysilicon layer formed over the silicon dioxide layer in accordance with an aspect of the present invention.
Figure 13:
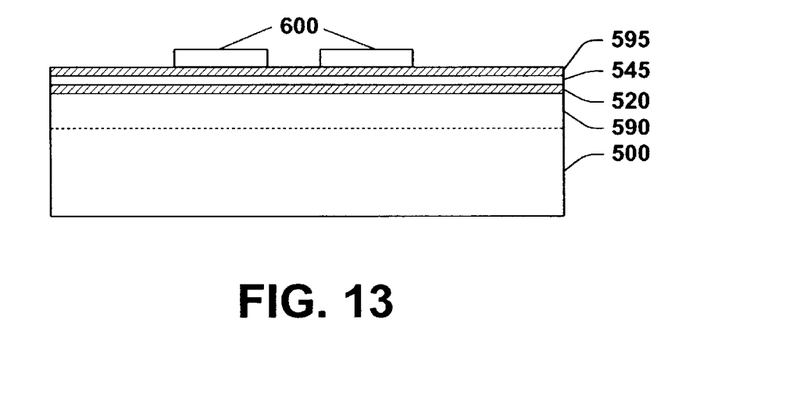
FIG. 13 illustrates a schematic cross-sectional view of an example of a partially fabricated dual bit memory cell in accordance with an aspect of the present invention.

As shown in FIG. 12, a P+ polysilicon gate layer 600 is deposited over the oxide layer 595. The P+ polysilicon layer provides a word line connection for the resulting memory cell. Employing a P+ polysilicon layer 600 facilitates the scaling down of memory cells, without compromising memory retention or cell life, in part, by allowing a bottom oxide layer of an ONO dielectric stack to be reduced to less than 50 angstroms in thickness. The P+ polysilicon layer 600 is patterned and etched so that the resulting word line is substantially perpendicular to the N+ channels that form the bit line.

Figure 14:
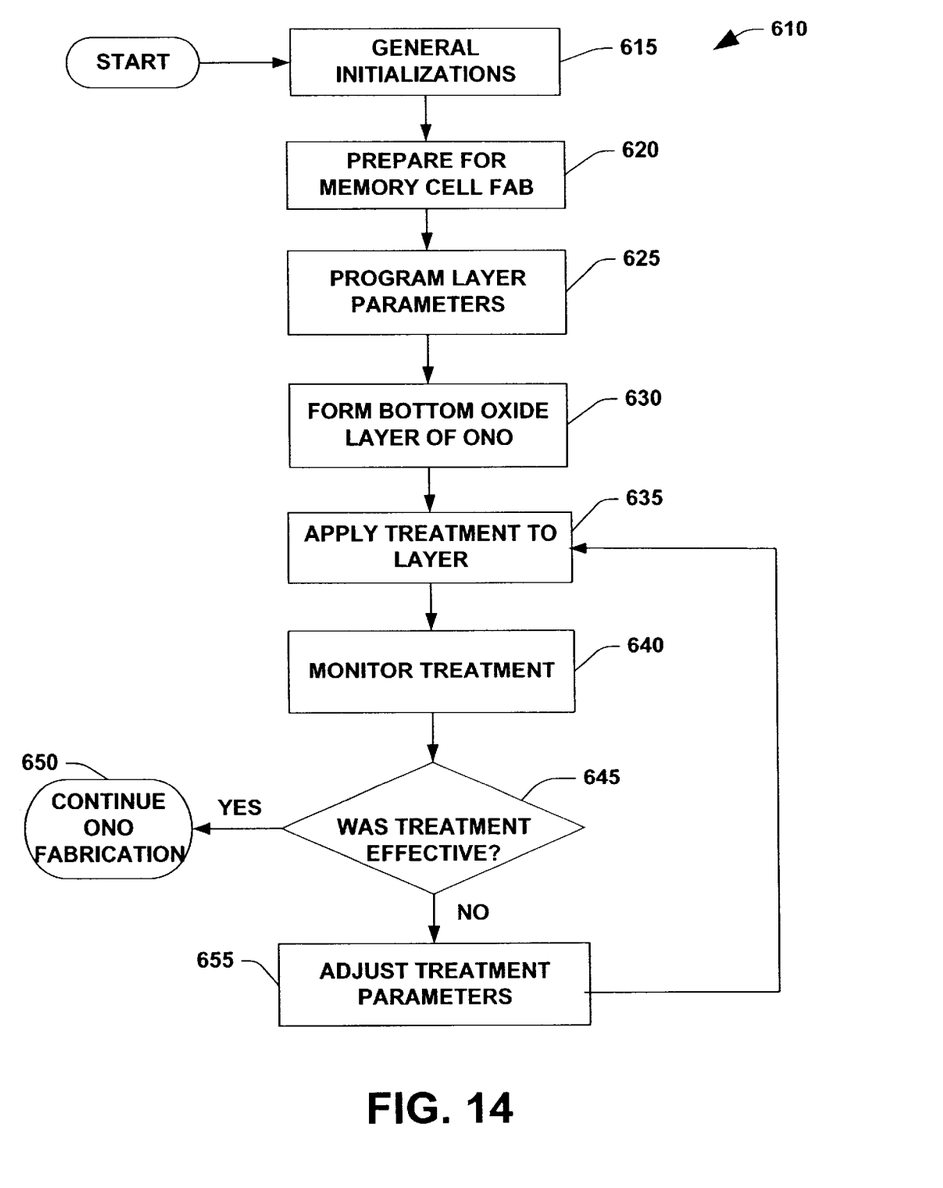
FIG. 14 illustrates a schematic flow diagram of an exemplary method for fabricating a dual bit memory cell using feedback data in accordance with an aspect of the present invention.

Referring now to FIG. 14, a flow diagram is shown according to an exemplary method 610 for controlling and monitoring in situ a process treatment with respect to the formation of an ONO dielectric stack. In particular, general initializations are made at 615 to accommodate ONO formation which includes a silicon nitride layer sandwiched between a bottom silicon dioxide layer and a top silicon dioxide layer. After the formation of each of the bottom silicon dioxide layer and the silicon nitride layer is substantially completed, each layer is treated with a particular treatment, respectively, before a subsequent layer is formed thereon. For example, the bottom silicon dioxide layer is substantially treated to minimize charge leakage before a subsequent layer can be formed thereon.

At 620, a p-type silicon substrate is prepared to receive a bottom silicon dioxide layer, for example. In addition, one or more layers of material may be formed on the substrate prior to the ONO formation thereon. At approximately this point in the fabrication process, deposition and process treatment parameters may be set and initialized (625).

The bottom silicon dioxide layer portion of the ONO dielectric stack is formed over the p-type silicon substrate in accordance with known deposition or growth methods. Once the bottom silicon dioxide layer is substantially formed and prior to silicon nitride formation thereon, a nitridation process treatment is applied to the bottom silicon dioxide layer. The nitridation process may involve a plasma containing nitrogen, such as nitrous oxide. The bottom silicon dioxide layer is exposed to the plasma containing nitrogen for a time and at a flow rate and pressure sufficient to incorporate nitrogen atoms into at least the surface of the bottom silicon dioxide layer. Generally, the nitridation process as applied to the bottom silicon dioxide layer facilitates mitigating charge leakage, particularly when the thickness of the bottom silicon dioxide layer is less than 50 angstroms.

Before, during, and after the nitridation process treatment, the bottom silicon dioxide layer is monitored by an ONO treatment monitoring system (640). The monitoring system collects data in the form of light reflectivities from the layer as it is being treated. At 645, such data can be used to determine whether the treatment was effective; or in other words, whether at least the surface of the layer has been modified as desired by the treatment.

A comparison analysis involving visually or mathematically comparing the data taken from the layer before, during, and after the treatment can be performed to determine whether the treatment was effective. If the treatment was effective, then the ONO fabrication process may continue with forming a silicon nitride layer over the nitridated bottom silicon dioxide layer. Formation of the silicon nitride layer is concluded when the silicon nitride is subjected to a hydrogen anneal/passivation treatment process in order to remove unwanted charge traps from at least the surface of the silicon nitride layer. The silicon nitride layer and the treatment process are also monitored as described above at 640.

However, if the treatment was not effective, then one or more treatment parameters may be adjusted at 655 according to the data collected from the bottom silicon dioxide layer. Following the adjustments, the treatment process may be repeated again for the same layer by returning to 635. Alternatively, the memory cell may be discarded.

Once the ONO dielectric stack has been formed, a P+ polysilicon gate layer may be formed thereon (not shown). The advantage of using a P+ polysilicon gate layer instead of an N+ polysilicon gate is that the former permits the bottom silicon dioxide layer to have a thickness less than 50 angstroms without causing charge tunneling. Thus, the P+ polysilicon as well as the nitridated bottom silicon dioxide layer and the hydrogen annealed silicon nitride layer facilitate the scaling down of memory cells without sacrificing memory retention and/or overall cell life.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making an ONO charge retaining dielectric stack on a memory cell using feedback control comprising:

forming a bottom silicon dioxide layer over said channel on the substrate;

applying a nitridation process treatment to the bottom silicon dioxide layer, the nitridation process treatment comprising a plasma containing nitrogen;

determining whether the nitridation process treatment is substantially completed;

after nitridating the bottom silicon dioxide layer, depositing a charge retention region over the nitridated bottom silicon dioxide layer;

annealing said charge retention region with plasma containing hydrogen;

determining whether the hydrogen anneal process treatment is substantially completed; and after annealing the charge retention region, depositing a top dielectric layer over the hydrogen annealed charge retention region.

2. The method of claim 1, wherein the top dielectric layer comprises silicon dioxide.

3. The method of claim 1, wherein said nitridated bottom silicon dioxide layer has a thickness from about 50 angstroms to about 140 angstroms.

4. The method of claim 1, wherein said charge retention region comprises at least one of silicon nitride and silicon dioxide.

5. An EEPROM memory device comprising a memory cell formed by the method of claim 1.

6. The method of claim 1, wherein said memory cell is a two bit memory cell.

7. The method of claim 1, wherein said substrate comprises a P-type substrate.

8. The method of claim 1, further comprising self-aligning an amount of charge in said charge retention region at a first junction between the first region and the substrate and at second a junction between the second region and the substrate in order to narrow said charge retention region to facilitate easier punch through.

9. The method of claim 1, wherein determining whether the nitridation process treatment is substantially completed comprises monitoring the bottom silicon dioxide before, during, and after the treatment to determine whether the treatment has effectively modified at least the surface of the bottom silicon dioxide layer.

10. The method of claim 1, wherein determining whether at least one of the hydrogen anneal process treatment is substantially completed comprises monitoring the charge retention region before, during, and after the treatment to determine whether the treatment has effectively modified at least the surface of the charge retention region.

11. The method of claim 1, further comprising:
collecting data from the bottom silicon dioxide layer before, during, and after the nitridation process treatment; and
feeding the data back to one or more nitridation process treatment components such that the components are adjusted according to such data.

12. The method of claim 1, further comprising:
collecting data from the charge retention region before, during, and after the hydrogen anneal process treatment; and
feeding the data back to one or more hydrogen anneal process treatment components such that the components are adjusted according to such data.

* * * * *